US006838021B2

(12) United States Patent
Khatter et al.

(10) Patent No.: US 6,838,021 B2
(45) Date of Patent: Jan. 4, 2005

(54) IRREGULAR SHAPED COPPER PARTICLES AND METHODS OF USE

(75) Inventors: Rajesh Khatter, Cary, NC (US); Anil V. Nadkarni, Chapel Hill, NC (US); Hsiao L. Cheng, Fuquay-Varina, NC (US)

(73) Assignee: SCM Metal Products, Inc., Research Triangle Park, NC (US)

( * ) Notice: Subject to any disclaimer, the term of this patent is extended or adjusted under 35 U.S.C. 154(b) by 0 days.

(21) Appl. No.: 10/013,629

(22) Filed: Dec. 10, 2001

(65) Prior Publication Data

US 2002/0149005 A1 Oct. 17, 2002

Related U.S. Application Data

(60) Provisional application No. 60/256,125, filed on Dec. 15, 2000.

(51) Int. Cl.[7] ............................... H01B 1/02; B22F 9/08
(52) U.S. Cl. ........................ 252/512; 419/23; 75/255; 75/331; 75/229; 75/337
(58) Field of Search ........................... 252/512; 419/23; 420/469; 75/255, 331, 952, 229, 337

(56) References Cited

U.S. PATENT DOCUMENTS

| 3,202,488 | A | | 8/1965 | Erhreich et al. |
| 4,353,816 | A | | 10/1982 | Iwasa |
| 4,960,459 | A | * | 10/1990 | Poole et al. .................. 419/63 |
| 5,534,045 | A | * | 7/1996 | Ogura et al. .................. 75/243 |
| 5,683,627 | A | * | 11/1997 | Katayama et al. .......... 252/512 |

FOREIGN PATENT DOCUMENTS

WO   WO 84/02864   *   8/1984

OTHER PUBLICATIONS

Klar et al "Copper P/M Products", Metals Handbook, 10th Ed. vol. 2, 1990 pp 392–402.*

* cited by examiner

Primary Examiner—Mark Kopec
(74) Attorney, Agent, or Firm—Kalow & Springut LLP; William D. Schmidt; David A. Kalow

(57) ABSTRACT

The present invention provides water atomized copper powder comprising substantially irregular shaped copper particles having at least a median $D_{50}$ particle size of from about 10 μm to about 50 μm. The powders of the present invention are suitable for use in electrically conductive compositions, such as copper-based adhesives. The present invention also provides methods of making these copper powders.

20 Claims, 1 Drawing Sheet

IRREGULAR SHAPED COPPER PARTICLES AND METHODS OF USE

This application claims the benefit of the filing date of Provisional Application No. 60/256,125, filed Dec. 15, 2000, entitled "Irregular Shaped Copper Particles and Methods of Use" this entire disclosure is hereby incorporated by reference into the present disclosure.

BACKGROUND OF THE INVENTION

Copper powders have been sought for many years for use in electrical applications because of its conductive properties. Copper is also less expensive than other metals (i.e. silver) leading to its wide commercial use.

There has been a considerable research effort to improve the conductivity of copper for microelectronic applications (i.e. adhesives). For this reason, the size of copper powder has been explored for electrical conductivity. In general, copper powder used in conductive adhesives is extremely fine (median particle size $D_{50}<10$ μm). Fine powder provides more particle contact and consequently higher electrical conductivity.

Fine copper powder is made by inert gas atomization, where molten copper is broken up by high-pressure inert gas which produces individual droplets that solidify into powder particles. Typically, these gas atomized particles are generally spherical in shape. Spherical particles provide a single point of contact with adjacent particles, although several particles may contact a single particle leading to many contact points. It is known that the larger the number of inter-particle contacts, the higher the electrical conductivity of the copper powder.

There are some disadvantages in using fine copper powders with a $D_{50}<10$ μm. One disadvantage is the cost of production. For example, the atomization process generates powder with a wide range of particle sizes. Selective use of fine particles lowers the yield of usable powder, and thus increases cost as the oversize particles must be either re-melted or scrapped. Another disadvantage is that copper has tendency to oxidize particularly when it is in fine particle form. For example, exposing fine copper powder to air for a short period of time will result in surface oxidation. The oxide form of copper increases contact resistance and reduces electrical conductivity, making it unfit for the some electrical applications i.e. microelectronic adhesives.

Other research efforts to improve the electrical conductivity of copper involve silver-coating copper particles to prevent oxidation. Silver is a highly electrically conductive metal. Even when oxidized, silver does not have substantially altered electrical conductivity. However, coating silver on the surface of copper adds significantly to production costs.

Some prior art references describe chemically treating copper powder with an anti-oxidizing film to improve electrical conductivity. Suitable anti-oxidizing films described are organic acid salts of higher aliphatic amines with 0.2 to 10 parts by weight of a boron-nitrogen dispensing agent and 0.1 to 10 parts by weight of a coupling agent, based on the total weight of the powder. Some coupling agents described are isopropyl-triisostreroyl-titanate and aceoalkoxy-aluminum-diisopropylate.

Other prior art references describe preventing oxidation of copper by surface treating copper powder or silver-coated copper powder with coupling and treating agents. The total amount of coupling and treating agents used is 0.1% to 10% based on the weight of the copper powder. Some coupling agents described are silane, titanate, aluminate and zirconate. One treating agent described in the prior art is ZB-3, which is the reaction product of peanut oil fatty acids, boric acid and triethanolamine.

Copper flakes have also been utilized to improve electrical conductivity. These flakes are said to provide less surface area per unit volume leading to improved particle contact when compared to copper powder. However, the surfaces of these copper flakes are cleaned to remove oxides and/or impurities. One disadvantage associated with copper flakes is that they require special handling to avoid oxidation. For example, typically copper flakes are stored in a nitrogen atmosphere and then quickly incorporated into the adhesive (i.e. epoxy) to preserve electrical conductivity.

Based on the disadvantages above, there is a need for copper powders that have excellent electrical conductivity for microelectronic applications. There is also a need for copper powders that are oxidatively stable, not requiring special handling.

SUMMARY OF THE INVENTION

The present invention provides copper powders with excellent electrical conductivity suitable for microelectronic applications. The copper powders of the present invention are substantially irregular in shape compared to prior art copper powder. This substantially irregular shape provides interlocking electrical contact points between adjacent particles leading to increased conductivity of the vehicle. Moreover, the copper powders of the present invention are oxidatively stable and require no special handling.

In one embodiment, the present invention provides water atomized copper powder comprising substantially irregular shaped copper particles having at least a median $D_{50}$ particle size of from about 10 μm to about 50 μm.

In another embodiment, the present invention provides an electrically conductive composition comprising: a) copper powder having substantially irregular shaped copper particles wherein the particles have a median $D_{50}$ particle size of from about 10 μm to about 50 μm and b) a vehicle for incorporating the copper powder.

In yet another embodiment, the present invention provides an electrically conductive adhesive comprising: a) from about 60 to about 80 weight percent copper powder having substantially irregular shaped copper particles wherein the particles have a median $D_{50}$ particle size of from about 10 μm to about 50 μm; b) an anti-oxidant compound for coating the copper powder; and c) an epoxy for incorporating the coated copper powder.

In still yet another embodiment, the present invention provides a process for preparing copper powder, comprising the steps of: a) water atomizing molten copper to form substantially irregular shaped copper powder having a median $D_{50}$ particle size of from about 10 μm to about 50 μm; and b) recovering the copper powder.

The present invention also provides a process for preparing an electrically conductive composition comprising: a) providing surface treated copper powder having substantially irregular shaped copper particles wherein the particles have a median $D_{50}$ particle size of from about 10 μm to about 50 μm; and b) mixing the copper powder with a vehicle to form the electrically conductive composition.

For a better understanding of the present invention together with other and further embodiments, reference is made to the following description taken in conjunction with the examples, the scope of which is set forth in the appended claims.

BRIEF DESCRIPTION OF THE DRAWINGS

Preferred embodiments of the invention have been chosen for purposes of illustration and description, but are not intended in any way to restrict the scope of the invention. The preferred embodiments of certain aspects of the invention are shown in the accompanying figures, wherein.

DETAILED DESCRIPTION OF THE INVENTION

In preparing the preferred embodiments of the present invention, various alternatives may be used to facilitate the objectives of the invention. These embodiments are presented to aid in an understanding of the invention and are not intended to, and should not be construed to, limit the invention in any way. All alternatives, modifications and equivalents that may become obvious to those of ordinary skill upon a reading of the present disclosure are included within the spirit and scope of the present invention.

This disclosure is not a primer on the manufacture of titanium dioxide pigments, basic concepts known to those skilled in the art have not been set forth in detail.

The copper powder of the present invention is obtained from high purity copper. Preferably, the copper is essentially pure, which means that the copper is essentially free, not only of oxides, but also of other impurities. Preferably, the copper is at least 90% free, more preferably at least 95% free and, most preferably, at least 99.9% free of impurities. In one embodiment the copper is at least 99% pure electrolytic copper.

The high purity copper is melted, preferably under a reducing atmosphere at temperatures easily determined by those skilled in the art. The molten copper is water atomized using high-pressure water jets to form copper droplets. These droplets have the tendency to spherodize (i.e. become spherical) as they solidify. This is because the spherical shape has the lowest free energy, and the particles seek the lowest energy state. Spherodization is a time dependant phenomenon and occurs due to the surface tension of the molten copper droplet. Water atomized copper droplets cool down and solidify into irregular shaped particles much faster than other atomization processes (i.e. gas). Water atomization does not allow sufficient time for the copper particle to spherodize. This leads to copper particles that are substantially irregular in shape. Water atomization of molten copper may produce some spherical copper particles that are smooth. These particles are less desirable to have in the powder because they have smaller number of contact points leading to less electrical conductivity than irregular shaped copper particles.

Figure 1:
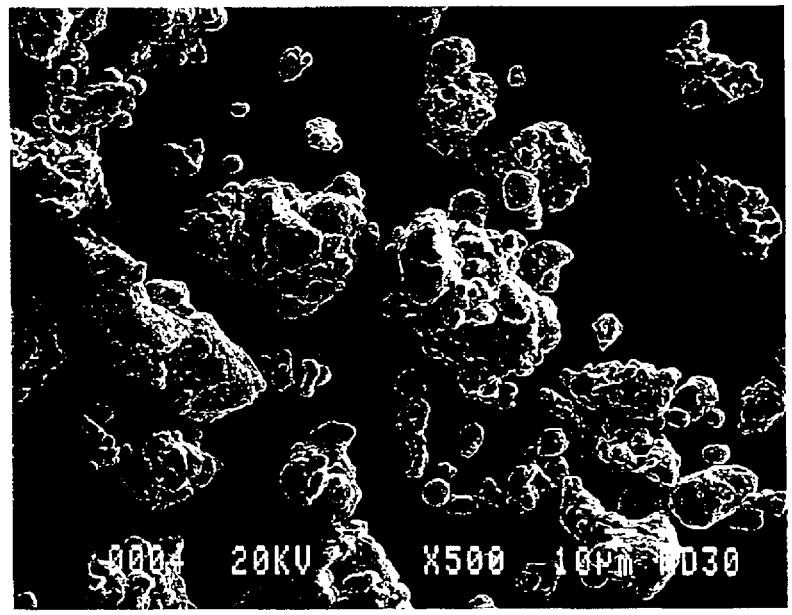
FIG. 1 illustrates the scanning electron microscope magnified 500 times of the inventive copper powder. This powder is substantially irregular and coarser in shape.

Copper particles that are substantially irregular shaped include those particles that are substantially non-spherical, not smooth and have projections and/or cavities on the surface of copper particles. Examples of copper shapes that are useful for this invention include, but are not limited to, non-spherical, granular, acicular, rods, and the like. For the purposes of the present invention, irregular shaped copper particles do not include flakes. Preferred irregular shaped copper particles are illustrated in FIG. 1.

The present invention stems in part from the recognition that irregular shaped particles mechanically interlock with adjacent particles providing a large number of inter-particle contacts. These contacts provide the conductive paths for the electrical current to flow. The larger the number of contact points, the higher the electrical conductivity.

The irregular shaped copper particles produced by water atomization are dried and separated by size according to methods known in the art. The preferred method of separation is by passing fractions of the copper particles through screens (i.e. mesh). Preferably, the copper particle size range is from about 10 $\mu$m to about 50 $\mu$m.

The copper powder separated by size comprises a median particle size range ($D_{50}$) where at least about 50% of the irregular shaped copper particles are in the size range of from about 10 $\mu$m to about 50 $\mu$m. The $D_{50}$ value shows particle size distribution as a median cumulative percent particle size. This value is known in the art to measure the fineness of the powder.

To optimize electrical conductivity, preferably, the copper powder of the present invention comprises at least about 70% irregular shaped copper particles as opposed to other shaped particles (i.e. spherical, flake), more preferably at least about 80% irregular shaped particles and most preferably at least 90% irregular shaped copper particles.

After or during separation of the desired irregular shaped copper particles, preferably, the copper is treated with heat or chemicals to remove copper oxides present on the surface of the powder particles. These treatments (heat or chemical) are well known to those skilled in the art. A preferred method of heat treatment includes heating the copper particles at temperatures of about 800° F. in hydrogen to remove the copper oxide.

Chemical treatment of copper that removes oxides from the copper surface is well known in the art. Typically, these treatments involve washing copper with an organic acid or solvent to remove unwanted oxides.

The heat or chemically treated irregular shaped particles having at least a median particle $D_{50}$ size range of between about 10 $\mu$m to about 50 $\mu$m. These copper particles can be incorporated directly into a vehicle. Alternatively, the copper particles can be surface treated to prevent re-oxidation and then incorporated into the vehicle. Methods of surface treating copper are known in the art, these methods include contacting the particles with an aqueous solution. The aqueous solution coats the copper particle preventing re-oxidation of the copper. Alternately, an antioxidant coating can be sprayed directly on the particles.

Anti-oxidant coatings can be those known in the art. Preferred anti-oxidant coatings include, but are not limited to, organic acid salts of higher aliphatic amines with 0.2 to 10 parts by weight of a boron-nitrogen dispensing agent and 0.1 to 10 parts by weight of a coupling agent, based on the total weight of the powder. Antioxidant coatings can have coupling agents and treating agents. Some known coupling agents include isopropyl-triisostreroyl-titanate, aceoalkoxy-aluminum-diisopropylate, silane, titanate, aluminate and zirconate, and the like. Treating agents include, but are not limited to, ZB-3, which is the reaction product of peanut oil fatty acids, boric acid, triethanolamine, and the like. Preferably, the total amount of coupling and treating agent used is 0.1% to 10% for each, based on the weight of the copper powder.

The copper powder is incorporated into a suitable vehicle. Preferably, the vehicle does not interfere with conductivity. Suitable vehicles possess good affinity for the copper powder and allow the copper powder to easily be suspended.

Suitable vehicles include adhesives, such as for example, pastes, epoxy resins, and the like. Some epoxy resins include bisphenol A-epichlorohydrin, epoxy novolac, cycloaliphatic type epoxy resins, and the like. These epoxy resins are known to those skilled in the art. Hardening agents can be used with the epoxy to allow hardening of the epoxy. Suitable hardening agents include polyamide, diethylenetriamine, diethylaminopropylamine, triethylenetetramine, methyl-4-endomethylene tetrahydrophthalic anhydride, hexadrophthalic anhydride, and the like.

In general, the ratio of the epoxy to the hardening agent can readily be determined by those skilled in the art. In the most preferred embodiment, 100 parts of epoxy are mixed with 86 parts of anhydride-based hardener to yield an epoxy/hardener system. The present invention includes, however, without limitation other ratios (i.e. 70 parts epoxy to 30 parts of hardening agent) that are suitable for the intended use.

When the adhesive is an epoxy curing temperatures and/or times can easily be determined by those skilled in the art. Curing allows the epoxy to harden and cross-link, suspending the copper powder in the epoxy. In one embodiment of the present invention, the curing temperatures/time is about 150° C. over a 10–12 minute cycle.

Preferably, the vehicle (i.e. adhesive) is loaded with at least about 60% by weight irregular shaped copper particles, more preferably at least about 80% irregular shaped particles and most preferably at least about 90% irregular shaped copper particles. The weight percent is based on the total weight of the composition comprising the vehicle and copper powder. This load of copper particles allows excellent electrical conductivity without interfering with viscosity and uniformity throughout the vehicle. In the most preferred embodiment, the epoxy is loaded with copper powder at about 78 to 80 weight percent based on the total weight of the composition.

For the purposes of the present invention, electrically conductive compositions comprise the irregular shaped copper powder having at least a median particle $D_{50}$ size range of between about 10 $\mu$m to about 50 $\mu$m, and a vehicle that the copper is incorporated or suspended in. The present invention also includes coupling agents and dispersing agents that may be incorporated into the vehicle provided such agents do not interfere with electrical conductivity of the composition.

The compositions of the present invention have excellent electrical conductivity or low electrical resistivity. For purposes of the present invention, electrical conductivity includes measuring volume electrical resistivity. Volume resistivity values in the range of about $10^{-4}$ ohm/cm$^2$ to about $10^{-2}$ ohm/cm$^2$ are desirable. Volume resistivity values in the range of about $10^{-3}$ ohm/cm$^2$ to about $10^{-2}$ ohm/cm$^2$ are preferred. Such preferred resistivity values are comparable to the expensive silver-based conductive adhesives used in microelectronic application.

Having now generally described the invention, the same may be more readily understood through the following reference to the following examples, which are provided by way of illustration and are not intended to limit the present invention unless specified.

EXAMPLES

The following examples are presented to aid in an understanding of the present invention and are not intended to, and should not be construed to, limit the invention in any way. All alternatives, modifications and equivalents that may become obvious to those of ordinary skill in the art upon reading the present disclosure are included within the spirit and scope of the invention.

The examples below show that the copper particles produced by water atomization are coarser and irregular in shape. This irregular shape allows the particles to interlock with each other and yield better electrical conductivity when incorporated into an adhesive. The electrical conductivity is comparable to silver-coated copper adhesives. Copper particles of the present invention are resistant to oxidation over extended periods of time.

Example 1

High purity electrolytic copper was melted under a reducing atmosphere. The molten copper was poured through a nozzle and the melt stream was broken up by high-pressure water jets. The droplets produced froze instantaneously into powder particles. The powder was dried and screened through a U.S. standard 325 mesh (44 $\mu$m) screen. The fraction passing through this screen (<44 $\mu$m) was heat treated at 800° F. in hydrogen to reduce any copper oxides present on the surface of the powder particles. The reduced powder was chemically treated to prevent excessive re-oxidation.

Particle Size Distribution

Table 1 below shows the particle size distribution of the copper particles of the present invention versus particles sizes of silver coated copper powder. It is convenient to show particle size distribution as cumulative percent particles larger than a measured size. For example, $D_{10}$ value represents 10% particles that are larger than the size shown for the particular powder. $D_{50}$, also called a median particle size, is used as a measure of the fineness of the powder. This represents the particle size at which 50% of the particles are larger than the size shown. The results of a commercial silver-coated copper powder are also shown. More particularly, Table 1 shows that the median particle size ($D_{50}$) of the inventive powder is about three times as large as the commercial silver coated copper powder.

TABLE 1

Particle Size Distribution of Copper Powders

| % Particles Size | Inventive Copper Powder ($\mu$m) | Silver Coated Copper Powder ($\mu$m) |
| --- | --- | --- |
| $D_{10}$ | 49.42 | 15.65 |
| $D_{25}$ | 40.01 | 12.59 |
| $D_{50}$ | 29.48 | 9.86 |
| $D_{75}$ | 19.77 | 7.55 |
| $D_{90}$ | 13.04 | 5.70 |

Figure 2:
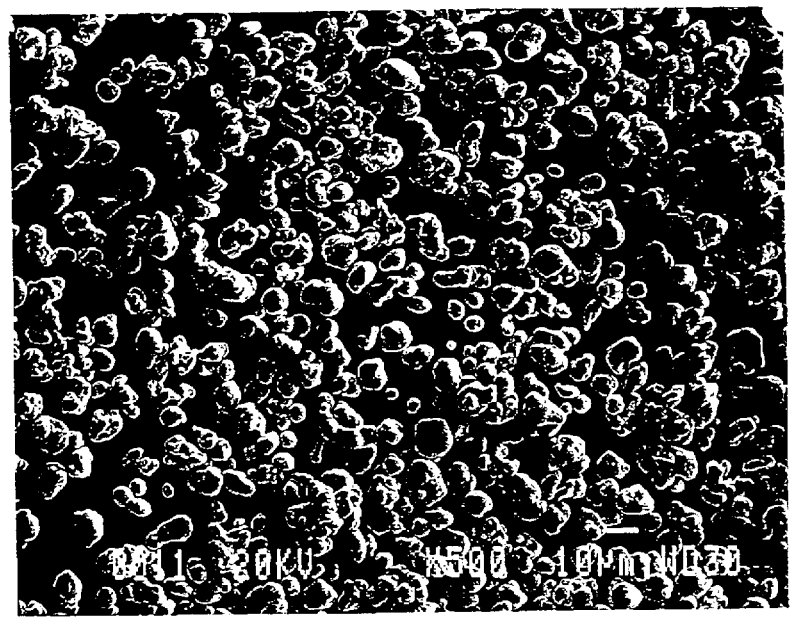
FIG. 2 illustrates the scanning electron microscope magnified 500 times of the silver coated copper powder. This powder is substantially spherical in shape.

Representative powder samples were examined under a Scanning Electron Microscope (SEM). FIG. 1 shows the irregular shaped copper powder of the present invention magnified 500 times. FIG. 2 shows silver coated copper powder magnified 500 times. The inventive powder shows much larger particle size than the silver-coated powder. The particles of the silver-coated powder are almost spherical while the particles of the inventive powder are more irregular. A spherical particle provides a single point of contact with an adjacent particle. When spherical copper particles are closely packed together, typically voids are found between the particles. These voids decrease electrical conductivity. Thus, electrical conductivity is not optimized. In contrast, an irregular shaped copper particle mechanically interlocks with an adjacent particle and provides a large number of inter-particle contacts. These contacts provide the conductive paths for electrical current to flow. Since electrical current flow takes the path of least resistance, irregular shaped particles provide more inter-particle contact points than spherical particles and thus optimize electrical conductivity.

Relative Oxidation

The inventive powder and the commercial silver-coated copper powder were analyzed to determine relative oxidation (oxygen content). A hydrogen loss method, commonly used in powder metal industry, was used for this determination. This method involves heating the powder at 1600° F. in a hydrogen atmosphere, then measuring the weight loss. The oxygen present in the powder combines with the hydrogen, forms water vapor and escapes the system. The weight loss represents the oxygen content in the original powder. The oxygen contents are shown in Table 2.

TABLE 2

| Percent Oxygen Content | |
|---|---|
| Inventive copper powder | Silver coated copper powder |
| 0.18% | 0.29% |

The results in Table 2 show that copper particles of the present invention resist oxidation.

Epoxy/Hardener System

The metals powders are each separately mixed with an epoxy/hardener system and loaded at >70% by weight. Copper acts as an electrical conductor whereas epoxy/hardener acts as an adhesive. Conductive adhesives are prepared by mixing metal powder with epoxy/hardener system. Once mixed, the adhesive is either screen/stencil printed or dispensed on a printed circuit board (PCB) depending on the application. The resulting PCB containing the adhesive is then passed through an oven in order to cure the epoxy. A cure temperature of 150° C. over a 10–12 minute cycle is required. Under these conditions, epoxy gets cross-linked. Once the epoxy is cross-linked, the cure cycle is complete and the copper powder stays suspended in the cured film. The use of conductive adhesive is different from that of solder paste where the solder powder melts and then forms a metallurgical bond between the devices to be joined. However, in the case of conductive adhesive, melting of the metal is not required and hence the whole process can be done at relatively lower temperature than solder paste application.

The results were surprising in that the resistance/conductivity values of the circuits produced using the inventive copper powder were comparable to those obtained using the silver coated copper powder. The shelf life of the copper powder of this invention was tested over a five-week period. The inventive copper powder was incorporated into an epoxy and tested over five weeks. The adhesive showed excellent electrical performance over the five weeks. The epoxy possessed a work life of 10–12 hours and cures at 150° C. over a 10–12 minute period. The hardener used for initiating the curing of epoxy is based on an anhydride system. The anhydride hardener system allows the formulated epoxy to possess long open time and minimize blushing of the cured adhesive. This is particularly important since the cured adhesive has to go through thermal aging testing and any moisture absorption by the cured epoxy will negatively impact its electrical properties. Moreover, this epoxy allows the incorporation of high levels of copper without significantly increasing the viscosity of the resulting adhesive.

Example 2

100 parts of a bisphenol-A based epoxy was mixed with 86 parts of anhydride-based hardener to yield an epoxy/hardener system. In this epoxy/hardener system, copper powder prepared in Example 1 was loaded at 78–80% level by weight. The resulting copper containing adhesive was then stencil printed on a FR-4-type board. The adhesive containing board was then cured at 150° C. over a 10–12 minute period. After the adhesive was cured, the volume resistivity was measured using a four-point probe. The volume resistivity of the copper filled adhesive was $10^{-2}$ ohm/cm². This is comparable to the silver-based conductive adhesive used in microelectronic application.

Having thus described and exemplified the invention with a certain degree of particularity, it should be appreciated that the following claims are not to be so limited but are to be afforded a scope commensurate with the wording of each element of the claim and equivalents thereof.

What is claimed:

1. Water atomized copper powder comprising substantially irregular shaped copper particles having at least a median $D_{50}$ particle size of about 30 μm to about 50 μm.

2. A copper powder according to claim 1, wherein the powder is surface treated to prevent oxidation.

3. An electrically conductive composition comprising: a) copper powder having substantially irregular shaped copper particles wherein the particles have a median $D_{50}$ particle size of from about 30 μm to about 50 μm and b) a vehicle for incorporating the copper powder.

4. An electrically conductive composition according to claim 3, wherein the copper particles are surface treated to prevent oxidation.

5. An electrically conductive composition according to claim 3, wherein the substantially irregular shaped copper particles provide interlocking electrical contact points between adjacent particles.

6. An electrically conductive composition according to claim 5, wherein the vehicle is an adhesive.

7. An electrically conductive composition according to claim 6, wherein the adhesive is a paste or epoxy.

8. An electrically conductive composition according to claim 7, wherein the adhesive, after incorporation of the copper powder, has an electrical resistivity of about $10^{-2}$ ohm/cm².

9. An electrically conductive composition according to claim 8, wherein the adhesive has a total copper powder content of from about 60 to about 80 weight percent based on the total weight of the adhesive.

10. An electrically conductive adhesive comprising:
a) from about 60 to about 80 weight percent copper powder having substantially irregular shaped copper particles wherein the particles have a median $D_{50}$ particle size of from about 30 μm to about 50 μm;
b) an anti-oxidant compound for coating the copper powder; and
c) an epoxy for incorporating the coated copper powder.

11. An electrically conductive adhesive according to claim 10, wherein the adhesive has an electrical resistivity of about $10^{-2}$ ohm/cm².

12. A process for preparing copper powder, comprising the steps of:
a) water atomizing molten copper to form substantially irregular shaped copper powder having a median $D_{50}$ particle size of from about 30 μm to about 50 μm; and
b) recovering the copper powder.

13. A process for preparing copper powder according to claim 12, further comprising: c) drying the recovered copper powder; and d) heating the dried copper powder to remove copper oxide.

14. A process for preparing copper powder according to claim 13, further comprising: e) surface treating the heated copper powder to prevent oxidation.

15. A process for preparing copper powder, comprising the steps of:
   a) water atomizing molten copper to form substantially irregular shaped copper powder having a median $D_{50}$ particle size of from about 30 μm to about 50 μm;
   b) recovering the copper powder;
   c) drying the recovered copper powder;
   d) heating the dried copper powder to remove copper oxide; and
   e) surface treating the heated copper powder to prevent oxidation.

16. A process for preparing an electrically conductive composition comprising:
   a) providing surface treated copper powder having substantially irregular shaped copper particles wherein the particles have a median $D_{50}$ particle size of from about 30 μm to about 50 μm; and
   b) mixing the copper powder with a vehicle to form the electrically conductive composition.

17. A process according to claim 16, wherein the electrically conductive composition is an adhesive.

18. A process according to claim 17, wherein the adhesive is a paste or an epoxy.

19. A process according to claim 18, wherein the adhesive has an electrical resistivity of about $10^{-2}$ ohm/cm$^2$.

20. A process according to claim 19, wherein the adhesive comprises a total copper powder content of from about 78 to about 80 weight percent based on the total weight of the adhesive.

* * * * *